United States Patent
Nagai (10) Patent No.: US 12,004,333 B2
(45) Date of Patent: Jun. 4, 2024

(54) POWER CONVERTER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 0 days.

(21) Appl. No.: 17/684,469

(22) Filed: Mar. 2, 2022

(65) Prior Publication Data
US 2022/0304198 A1   Sep. 22, 2022

(30) Foreign Application Priority Data
Mar. 16, 2021  (JP) .................. 2021-042132

(51) Int. Cl.
*H05K 7/20*  (2006.01)
*H01L 23/473*  (2006.01)
*H02M 7/537*  (2006.01)

(52) U.S. Cl.
CPC ....... *H05K 7/20927* (2013.01); *H01L 23/473* (2013.01); *H02M 7/537* (2013.01)

(58) Field of Classification Search
CPC ... H05K 7/20927; H01L 23/473; H02M 7/537
See application file for complete search history.

(56) References Cited

U.S. PATENT DOCUMENTS

| | | | |
|---|---|---|---|
| 5,623,399 A | 4/1997 | Ishii et al. | |
| 10,014,236 B2* | 7/2018 | Adachi | H01L 23/3675 |
| 10,453,776 B2* | 10/2019 | Usui | H01L 28/40 |
| 2016/0016475 A1 | 1/2016 | Toda et al. | |
| 2016/0307822 A1* | 10/2016 | Usui | H01L 23/49562 |

FOREIGN PATENT DOCUMENTS

| | | |
|---|---|---|
| JP | 2004-312866 A | 11/2004 |
| JP | 2012-105419 A | 5/2012 |
| JP | 2014-011926 A | 1/2014 |
| JP | 2020-141540 A | 9/2020 |

* cited by examiner

*Primary Examiner* — Mukundbhai G Patel
(74) *Attorney, Agent, or Firm* — POSZ LAW GROUP, PLC

(57) ABSTRACT

A power converter includes: a semiconductor module that includes a semiconductor element for power conversion, the semiconductor module having a module surface on which an input terminal electrically connected to the semiconductor element is disposed; a capacitor in which a capacitor terminal is disposed, the capacitor having a capacitor surface facing the module surface; a cooler that is disposed between the semiconductor module and the capacitor; and a connecting member that electrically connects the input terminal and the capacitor terminal.

6 Claims, 6 Drawing Sheets

POWER CONVERTER

CROSS REFERENCE TO RELATED APPLICATION

The present application claims the benefit of priority from Japanese Patent Application No. 2021-042132 filed on Mar. 16, 2021. The entire disclosures of all of the above applications are incorporated herein by reference.

TECHNICAL FIELD

The present disclosure relates to a power converter.

BACKGROUND ART

There has been known a power converter including a plurality of semiconductor modules, which house semiconductor elements for power conversion, and other electric devices. The power converter also includes a plurality of coolers that are configured to cool the plurality of semiconductor modules and the electric devices. The plurality of semiconductor modules and the plurality of coolers are alternately stacked with each other one by one. The other electrical devices are also in contact with the coolers.

SUMMARY

According to one aspect of the present disclosure is a power converter including a semiconductor module, a capacitor, and a cooler. The semiconductor module includes a semiconductor element for power conversion. The semiconductor module has a module surface on which an input terminal electrically connected to the semiconductor element is disposed. The capacitor in which a capacitor terminal is disposed has a capacitor surface facing the module surface. The cooler is disposed between the semiconductor module and the capacitor. A connecting member electrically connects the input terminal and the capacitor terminal.

DESCRIPTION OF EMBODIMENTS

To begin with, a relevant technology will be described first only for understanding the following embodiments.

In a typical power converter, terminals of the semiconductor modules extend in a direction intersecting the stacking direction of the semiconductor modules and the coolers. In addition, unnecessary spaces are formed around connecting members that electrically connect the terminals of the semiconductor modules and the other devices. Thus, such a power converter usually requires a large space for housing the power converter. In view of the above, the present disclosure provides a power converter having a small size.

As described above, according to one aspect of the present disclosure, a power converter includes a semiconductor module, a capacitor, and a cooler. The semiconductor module includes a semiconductor element for power conversion. The semiconductor module has a module surface on which an input terminal electrically connected to the semiconductor element is disposed. The capacitor in which a capacitor terminal is disposed has a capacitor surface facing the module surface. The cooler is disposed between the semiconductor module and the capacitor. A connecting member electrically connects the input terminal and the capacitor terminal.

In the power converter according to the one aspect, the semiconductor module, the cooler, and the capacitor are stacked with each other, the input terminal of the semiconductor module faces the cooler, and the capacitor terminal also faces the cooler. Therefore, there is no unnecessary space formed around the terminals. Further, since the connecting member for electrically connecting the input terminal and the capacitor terminal can be arranged along the cooler, no unnecessary space is formed around the connecting member. Accordingly, a power converter having a small size can be realized. Since the connecting member does not protrude from a stacking body formed of the semiconductor module, the cooler, and the capacitor, the power converter according to the present disclosure can be efficiently housed in, for example, a front compartment space of an electric vehicle.

The cooler may include a groove or a hole that passes through the cooler from one side facing the semiconductor module to an other side facing the capacitor, and the groove or the hole may overlap the input terminal when viewed in a stacking direction of the semiconductor module, the cooler, and the capacitor. Accordingly, the cooler can effectively cool the semiconductor element.

The hole or the groove may be filled with an insulation member. Accordingly, insulation between the connecting member and the cooler can be realized. Further, the semiconductor module and the capacitor may be fixed to the cooler.

The semiconductor element may be positioned around a center area of the semiconductor module when viewed in the stacking direction, and the groove or the hole may be disposed outside of the semiconductor element. By arranging the semiconductor element around the center area and setting the groove or the hole through which the connecting member passes at a position outside of the semiconductor element, it is possible to reduce influence due to the hole or the groove on a cooling efficiency (cooling efficiency for the semiconductor element).

The input terminal may include a positive input terminal and a negative input terminal, and the capacitor terminal may include a positive capacitor terminal and a negative capacitor terminal. The connecting member may include a positive connecting member that electrically connects the positive input terminal and the positive capacitor terminal and a negative connecting member that electrically connects the negative input terminal and the negative capacitor terminal. In that case, it is preferable that the positive connecting member and the negative connecting member overlap each other. Accordingly, a magnetic field generated in the positive connecting member and a magnetic field generated in the negative connecting member cancel each other, and thus the inductance of the connecting member can be reduced. If a part of the positive connecting member and a part of the negative connecting member overlap each other, the effect of reducing the inductance can be attained.

The semiconductor element included in the semiconductor module may include six switching elements that form a three-phase AC inverter. In this case, it is preferable that an output terminal of the three-phase AC inverter is arranged on the module surface, and an output member electrically connected to the output terminal is disposed in the cooler. No unnecessary spaces are formed around the output terminal, and thus the size of the power converter can be further reduced.

Next, a plurality of embodiments will be described below.

First Embodiment

Figure 1:
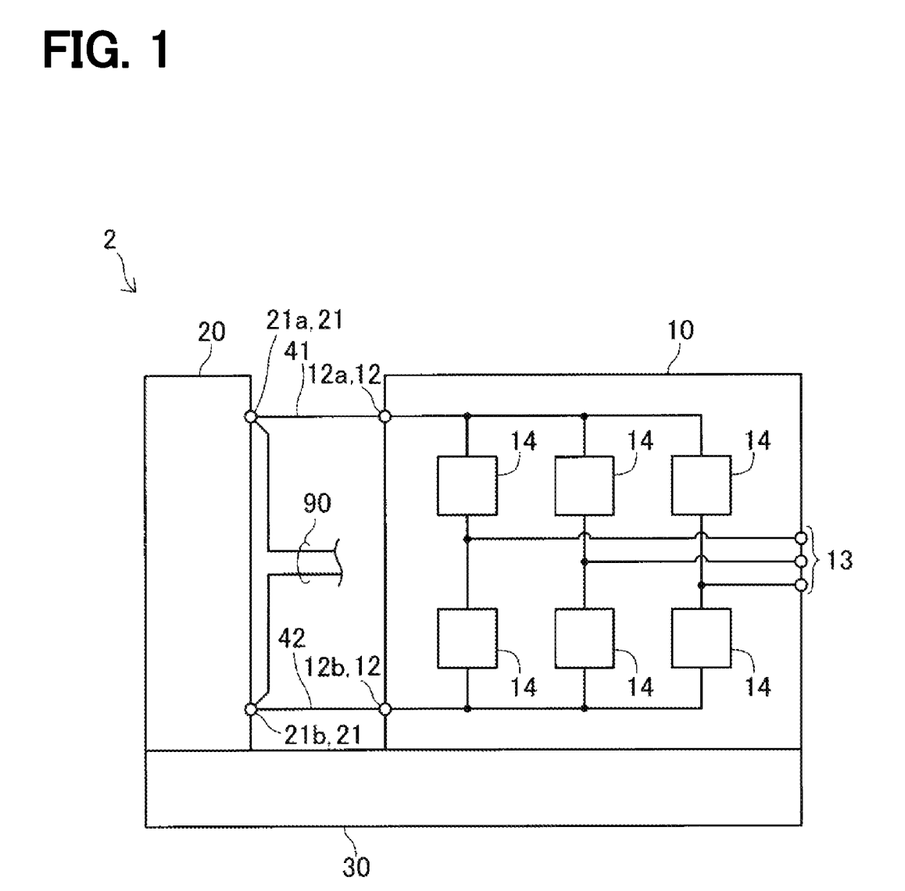
FIG. 1 is a schematic configuration diagram of a circuit of a power converter.

The power converter 2 according to the first embodiment will be described with reference to the drawings. FIG. 1 shows a schematic configuration diagram of the power converter 2. The power converter 2 includes a semiconductor module 10, a capacitor 20, and a cooler 30. The semiconductor module 10 includes six switching elements 14. Each of the six switching elements 14 is one type of semiconductor elements. The six switching elements 14 form an inverter circuit. The semiconductor module 10 converts DC power input to input terminals (i.e., a positive input terminal 12a and a negative input terminal 12b) into AC power, and outputs the AC power from an output terminal 13. Hereinafter, for convenience of explanation, the positive input terminal 12a and the negative input terminal 12b may be collectively referred to as an input terminal 12.

The capacitor 20 is electrically connected to the input terminal 12. The capacitor 20 has a positive capacitor terminal 21a and a negative capacitor terminal 21b. The positive capacitor terminal 21a and the positive input terminal 12a are connected to each other by a positive connecting member 41, and the negative capacitor terminal 21b and the negative input terminal 12b are connected to each other by a negative connecting member 42. Hereinafter, for convenience of explanation, the positive capacitor terminal 21a and the negative capacitor terminal 21b may be collectively referred to as a capacitor terminal 21. A DC power supply (not shown) is connected to the capacitor terminal 21 through a bus bar 90. The electric power of the DC power supply is supplied to the semiconductor module 10 through the bus bar 90 and the connecting members (the positive connecting member 41 and the negative connecting member 42).

The semiconductor module 10 (the switching elements 14) and the capacitor 20 generate heat. The power converter 2 includes the cooler 30 that cools the semiconductor module 10 and the capacitor 20. The cooler 30 is in contact with the semiconductor module 10 and the capacitor 20.

Figure 2:
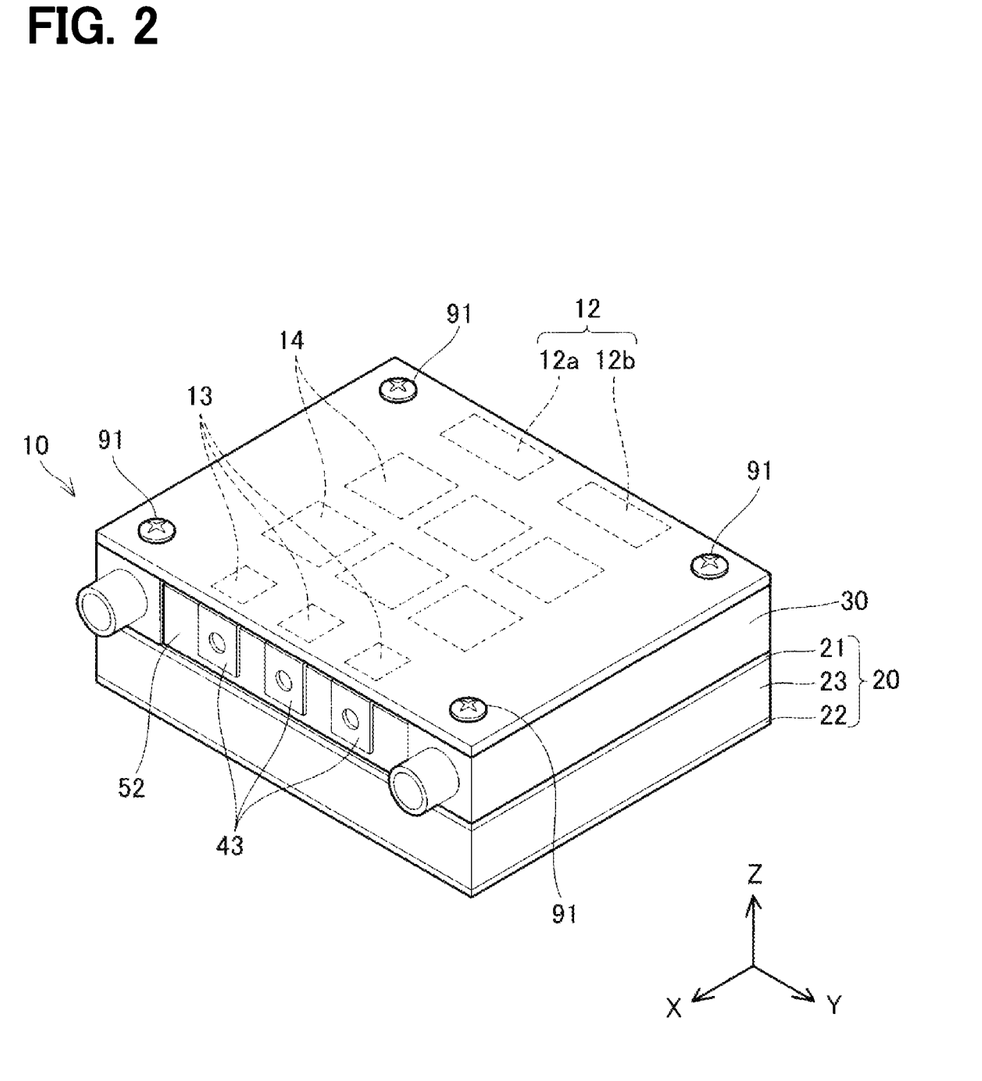
FIG. 2 is a perspective view of the power converter according to a first embodiment.
Figure 3:
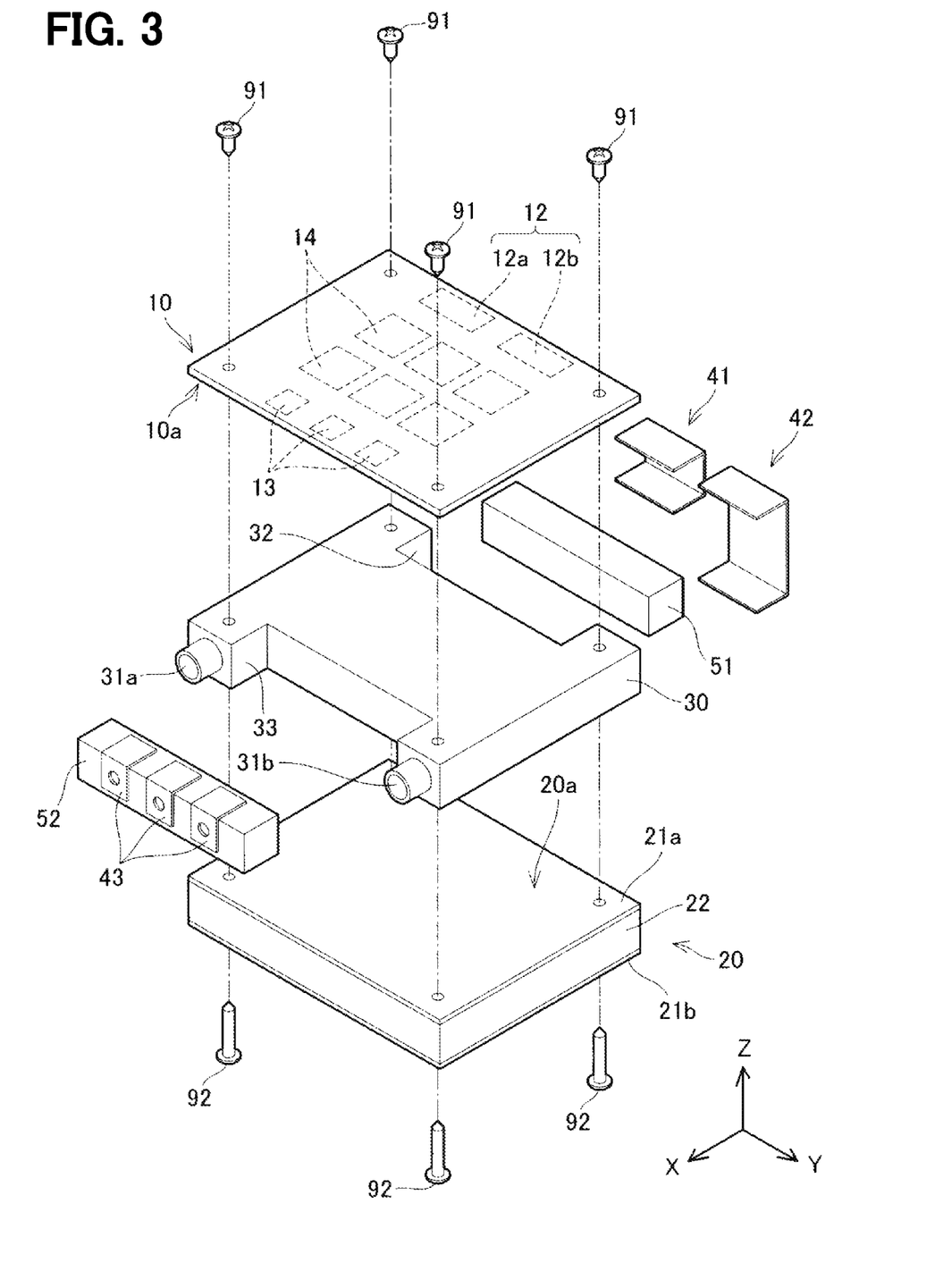
FIG. 3 is an exploded view of the power converter according to the first embodiment.

FIG. 2 shows an exterior of the power converter 2, and FIG. 3 shows an exploded view of the power converter 2. For convenience of explanation, the +Z direction of the coordinate system in the figures is defined as "up".

The semiconductor module 10, the cooler 30, and the capacitor 20 are stacked with each other in this order. In other words, the cooler 30 is arranged between the semiconductor module 10 and the capacitor 20. The semiconductor module 10 is fixed to the cooler 30 with screws 91, and the capacitor 20 is fixed to the cooler 30 with screws 92. The semiconductor module 10 (the switching elements 14) is cooled with an upper surface of the cooler 30, and the capacitor 20 is cooled with a lower surface of the cooler 30.

The semiconductor module 10 has a plate shape, and the six switching elements 14 are disposed therein. In FIGS. 2 and 3, two switching elements are designated by reference numerals 14, and no reference numerals are assigned to the remaining switching elements. The input terminal 12 and the output terminal 13 are arranged on the lower surface 10a of the semiconductor module 10.

The capacitor 20 includes a capacitor element 22, the positive capacitor terminal 21a, and the negative capacitor terminal 21b. The positive capacitor terminal 21a is arranged on the upper surface 20a of the capacitor 20, and the negative capacitor terminal 21b is arranged on the lower surface of the capacitor 20.

The cooler 30 has refrigerant ports 31a and 31b on a side surface of the cooler 30. Refrigerant is supplied from the refrigerant port 31a. The supplied refrigerant spreads inside the cooler 30 and cools the semiconductor module 10 and the capacitor 20. The refrigerant that has absorbed heat from the semiconductor module 10 and the capacitor 20 is discharged from the refrigerant port 31b.

The cooler 30 includes grooves 32 and 33 that pass through the cooler 30 from one side facing the semiconductor module 10 to the other side facing the capacitor 20. The groove 32 is arranged at a position to face the input terminal 12. The positive connecting member 41 and the negative connecting member 42 are fixed to the input terminal 12. The positive connecting member 41 electrically connects the positive input terminal 12a of the semiconductor module 10 and the positive capacitor terminal 21a of the capacitor 20. The negative connecting member 42 electrically connects the negative input terminal 12b and the negative capacitor terminal 21b.

The groove 32 is filled with an insulation member 51. Each of the positive connecting member 41 and the negative connecting member 42 is bent in a U shape along the insulation member 51. The positive capacitor terminal 21a is arranged on the upper surface of the capacitor 20, and the positive connecting member 41 extends along three surfaces of the insulation member 51. Since the negative capacitor terminal 21b is arranged on the lower surface of the capacitor 20, the negative connecting member 42 extends downward beyond the positive connecting member 41.

The groove 33 is arranged at a position to face the output terminal 13. Output members 43 are fixed to the output terminal 13. The groove 33 is filled with an insulation member 52. Each of the output members 43 is bent in an L shape along two surfaces of the insulation member 52. The output terminal 13 faces the cooler 30, and is not visible from the outside of the power converter 2, but the L-shaped output members 43 are exposed on a side surface of the power converter 2. The output members 43 are fixed to the cooler 30 together with the insulation member 52. In other words, the output members 43 and the insulation member 52 constitute part of the cooler 30.

Figure 4:
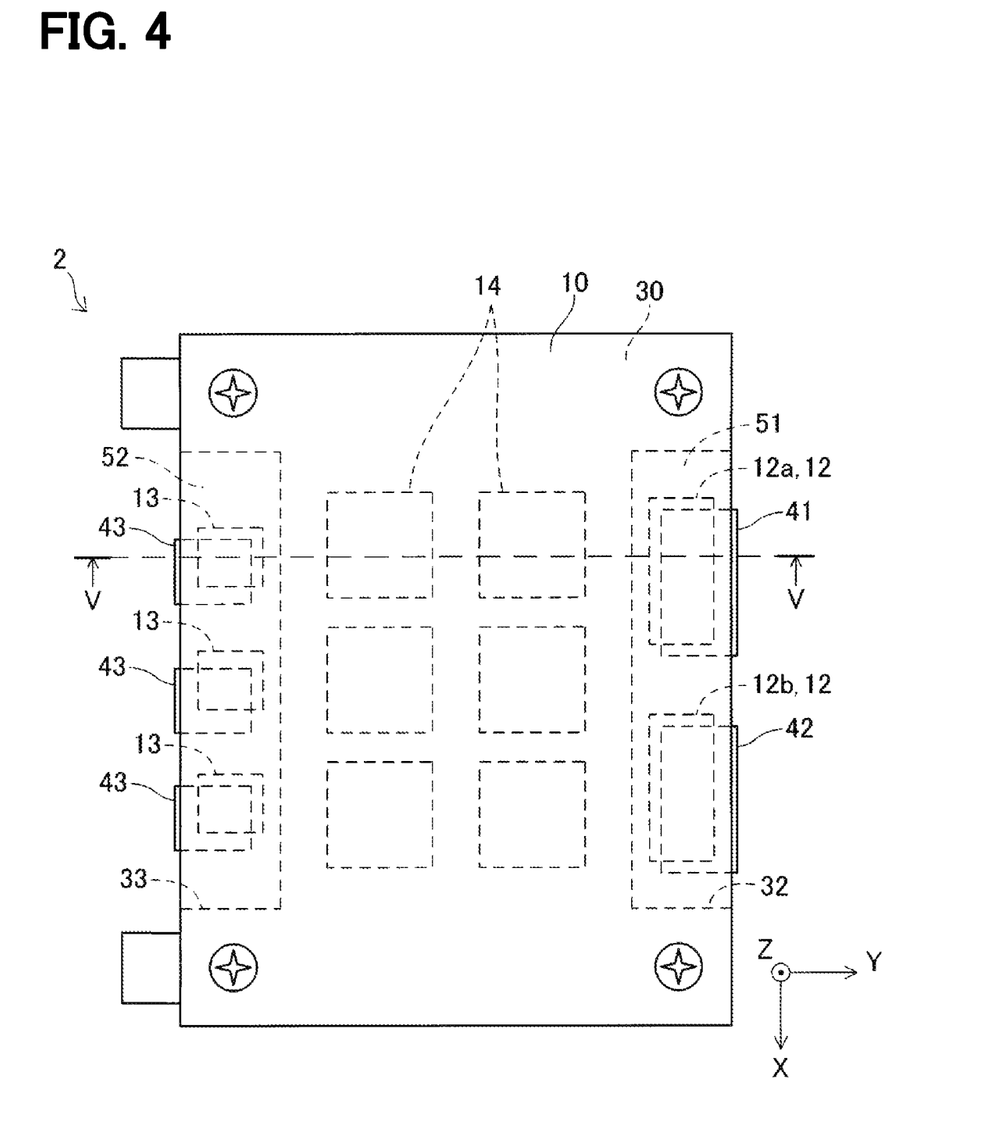
FIG. 4 is a plan view showing the power converter.

FIG. 4 shows a plan view of the power converter 2. FIG. 4 corresponds to a view seen in the stacking direction of the semiconductor module 10, the cooler 30, and the capacitor 20. In FIG. 4, two switching elements are designated by reference numerals 14, and no reference numerals are assigned to the remaining switching elements.

The cooler 30 has the grooves 32 and 33, and as described above, the groove 32 and the input terminal 12 overlap each other and the groove 33 and the output terminal 13 overlap each other when viewed in the stacking direction. The groove 32 is filled with the insulation member 51, and the groove 33 is filled with the insulation member 52. Further, when viewed in the stacking direction, the six switching elements 14 are arranged around the center area of the semiconductor module 10, and the input terminal 12 and the output terminal 13 are arranged at a position outside of the switching elements 14.

Figure 5:
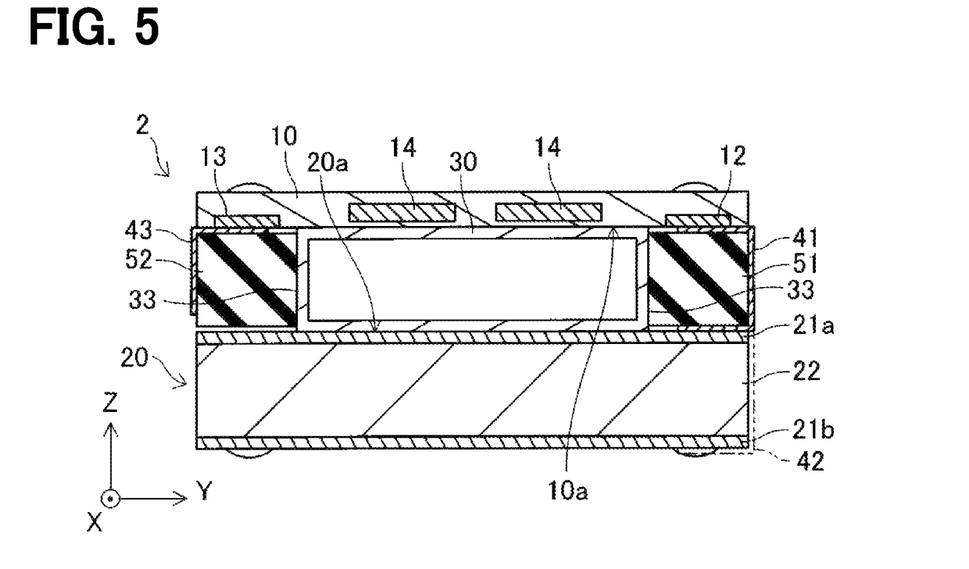
FIG. 5 is a cross-sectional view of the power converter taken along V-V line in FIG. 4.

FIG. 5 shows a cross-section of the power converter 2 taken along V-V line in FIG. 4. FIG. 5 shows a cross-section of the power converter 2 taken along a virtual plane that passes through the positive connecting member 41. The inside of the cooler 30 is hollow, and the refrigerant flows through the hollow. As can be understood from FIG. 5, the cooler 30 faces the switching elements 14, but the grooves 32 and 33 are provided in a region facing the input terminal 12 and the output terminal 13, respectively. The cooler 30 is positioned in a region facing the switching elements 14, and thus the switching elements 14 can be efficiently cooled. In other words, since the insulation members 51 and 52 are outside of the region facing the switching elements 14, it is possible to reduce the influence by the insulation members 51 and 52 when cooling the switching elements 14.

The input terminal 12 and the output terminal 13 are disposed on the lower surface 10a of the semiconductor module 10, and the positive capacitor terminal 21a is disposed on the upper surface 20a of the capacitor 20. The lower surface 10a of the semiconductor module 10 and the upper surface 20a of the capacitor 20 face each other, and the cooler 30 is interposed therebetween. The positive connecting member 41 that electrically connects the positive input terminal 12a and the positive capacitor terminal 21a extends along the cooler 30 (along the insulation member 51 of the cooler 30) without forming unnecessary spaces around the positive connecting member 41. In FIG. 5, the negative connecting member 42 is drawn by a virtual line. The negative capacitor terminal 21b is arranged on the lower surface of the capacitor 20, and the negative connecting member 42 extends along the cooler 30 and the capacitor 20. There is also no space formed around the negative connecting member 42. The power converter 2 is small in size because no space is formed around the connecting members 41 and 42. Further, the output member 43 also extends along the cooler 30 (the insulation member 52) so as not to form unnecessary spaces around the output member 43. The arrangement of the output member 43 also contributes to reducing the size of the power converter 2.

The semiconductor module 10 has a plate shape, and the cooler 30 and the capacitor 20 have a flat shape. Since the semiconductor module 10, the cooler 30, and the capacitor 20 are stacked with each other so that the wide surfaces of the semiconductor module 10, the cooler 30, and the capacitor 20 face each other, the exterior of the power converter 2 has a substantially rectangular parallelepiped shape. Further, the connecting members (the positive connecting member 41 and the negative connecting member 42) and the output member 43 are arranged along the cooler 30, and the members do not protrude from the rectangular parallelepiped shape of the power converter 2. Since the exterior of the power converter 2 including the connection members 41 and 42, and the output member 43 is almost rectangular parallelepiped, no space is formed in a housing space that houses the power converter 2.

The insulation member 51 is arranged between the connecting members 41, 42 and the cooler 30, and the insulation member 52 is arranged between the output member 43 and the cooler 30. The insulation member 51 enhances insulation between the connecting members 41, 42 and the cooler 30. The insulation member 52 enhances insulation between the output member 43 and the cooler 30.

Second Embodiment

Figure 6:
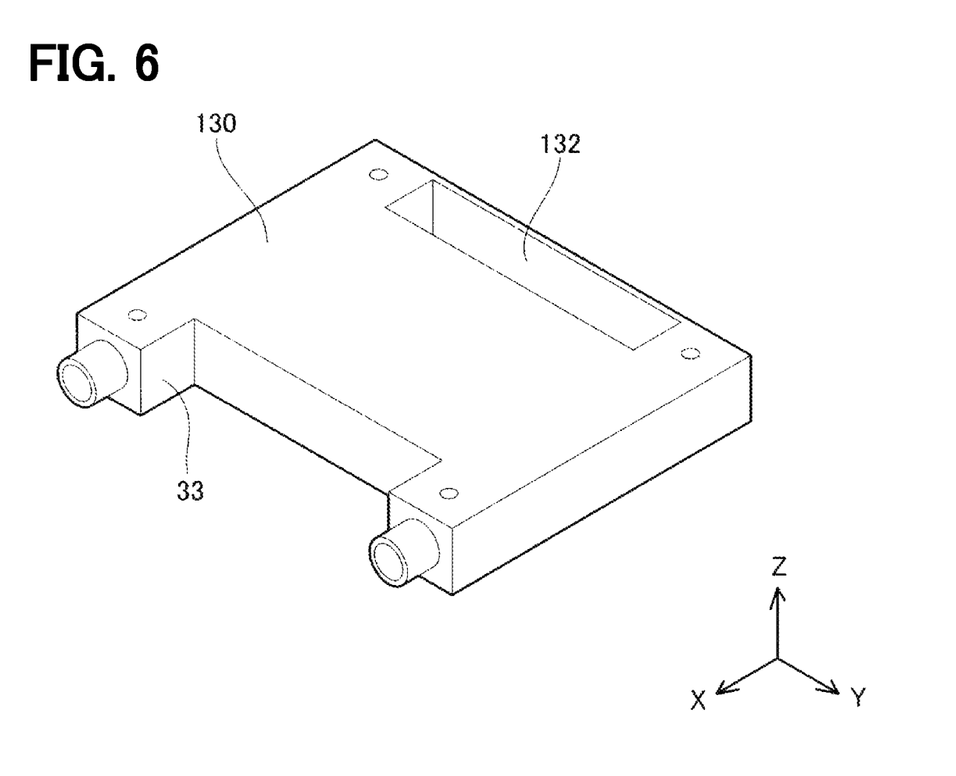
FIG. 6 is a perspective view of a cooler of the power converter according to a second embodiment.

The power converter according to the second embodiment will be described. In the power converter according to the second embodiment, the shape of the cooler 130 is different from that of the cooler 30 of the power converter 2 described in the first embodiment. A perspective view of the cooler 130 is shown in FIG. 6. Devices other than the cooler 130 are not shown. The cooler 130 is provided with a hole 132 in place of the groove 32 of the first embodiment. The hole 132 passes through the cooler 130 from one side facing the semiconductor module 10 to the other side facing the capacitor 20. The connecting member that electrically connects the input terminal and the capacitor terminal passes through the hole 132. The hole is filled with an insulation member. The power converter of the second embodiment can be also small in size. In the power converter of the second embodiment, the connecting member is not exposed and therefore safety can be increased.

Third Embodiment

Figure 7:
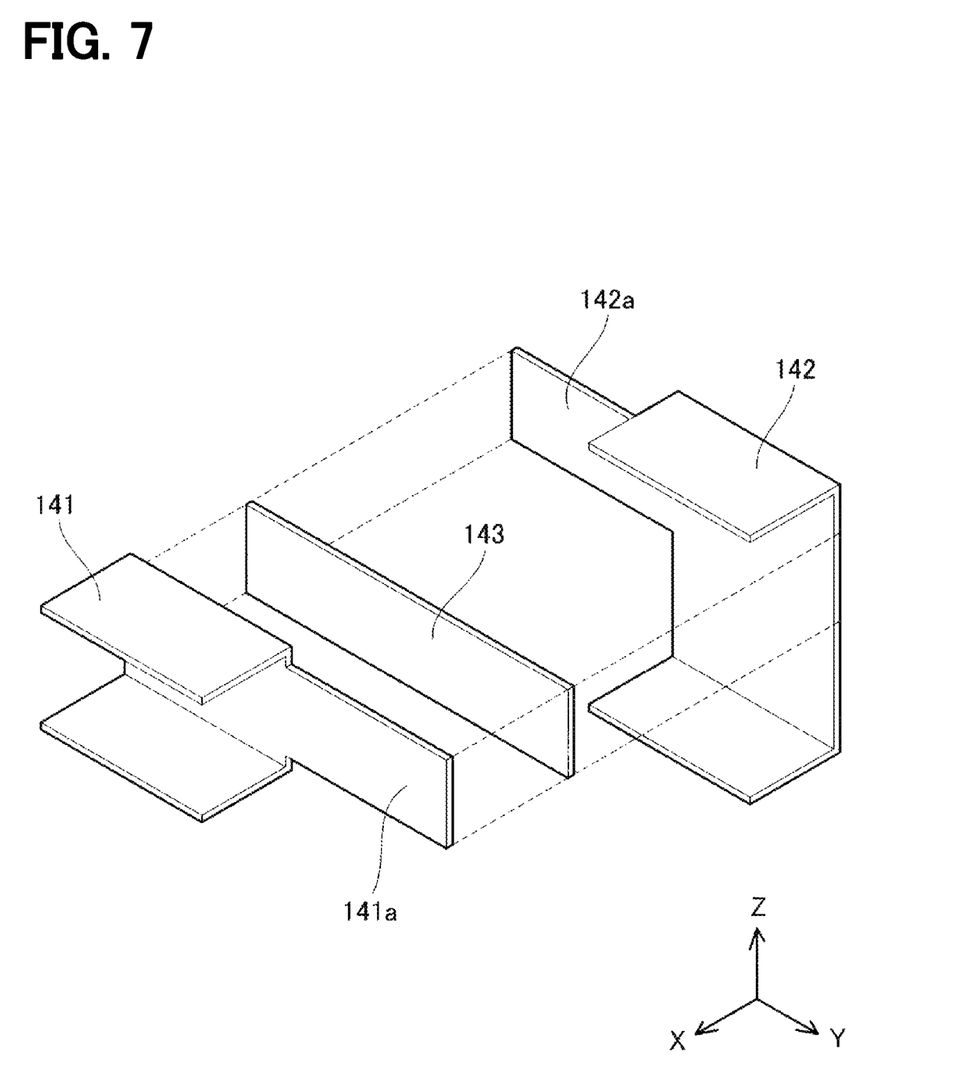
FIG. 7 is a perspective view of a connecting member of the power converter according to a third embodiment.

The power converter according to the third embodiment will be described. In the power converter of the third embodiment, the positive connecting member and the negative electrode member are different from those of the embodiment. FIG. 7 shows a perspective view of the positive connecting member 141 and the negative connecting member 142. Members other than the positive connecting member 141 and the negative connecting member 142 are not shown.

The positive connecting member 141 includes a flat piece portion 141a, and the negative connecting member 142 includes a flat piece portion 142a. The positive connecting member 141 and the negative connecting member 142 overlap each other across an insulating plate 143 that is interposed therebetween. The piece portion 141a of the positive connecting member 141 overlaps with the negative connecting member 142, and the piece portion 142a of the negative connecting member 142 overlaps the positive connecting member 141. The piece portions 141a and 142a expand an overlapping area of the positive connecting member 141 and the negative connecting member 142. The direction of the current flowing through the positive connecting member 141 and the direction of the current flowing through the negative connecting member 142 are opposite to each other. Currents flowing in opposite directions in the overlapping area cancel magnetic fields generated by these currents and thus reduce the inductance of both connecting members. Since a part of the positive connecting member 141 and a part of the negative connecting member 142 overlap each other, the inductance of both is reduced.

The points to be noted regarding the technique of the embodiments are described. The switching element 14 of the embodiment may be one example of a semiconductor element. The technique disclosed herein can be applied to a power converter having a semiconductor element other than the switching element 14.

Although specific examples of the present disclosure have been described in detail above, these are merely examples and do not limit the scope of the present description. The techniques described in the claims include various modifications and modifications of the specific examples illustrated above. In addition, the technical elements described in the present description or the drawings exhibit technical usefulness alone or in various combinations, and are not limited to the combinations described in the claims at the time of filing. In addition, the techniques illustrated in the present specification or drawings can achieve multiple purposes at the same time, and achieving one of the purposes itself has technical usefulness.

The invention claimed is:

1. A power converter, comprising:
a semiconductor module that includes a semiconductor element for power conversion, the semiconductor module having a module surface on which an input terminal electrically connected to the semiconductor element is disposed;
a capacitor in which a capacitor terminal is disposed, the capacitor having a capacitor surface facing the module surface;
a cooler that is disposed between the semiconductor module and the capacitor; and a connecting member that electrically connects the input terminal and the capacitor terminal, wherein
the cooler includes a groove that passes through the cooler from one side facing the semiconductor module to an other side facing the capacitor,
the groove overlaps the input terminal when viewed in a stacking direction of the semiconductor module, the cooler, and the capacitor,
the groove is filled with an insulation member,
the input terminal includes a positive input terminal and a negative input terminal,
the capacitor terminal includes a positive capacitor terminal and a negative capacitor terminal,
the connecting member includes a positive connecting member that electrically connects the positive input terminal and the positive capacitor terminal and a negative connecting member that electrically connects the negative input terminal and the negative capacitor terminal,
the insulation member has a first surface facing the semiconductor module, a second surface facing the capacitor, and a side surface connecting the first surface and the second surface, and
one of the positive connecting member and the negative connecting member is disposed to extend along the first surface, the side surface, and the second surface of the insulation member.

2. The power converter according to claim 1, wherein
the semiconductor element is positioned around a center area of the semiconductor module when viewed in the stacking direction, and
the groove is disposed outside of the semiconductor element.

3. The power converter according to claim 1, wherein
the semiconductor module and the capacitor are fixed to the cooler.

4. The power converter according to claim 1, wherein
the positive connecting member and the negative connecting member overlap each other.

5. The power converter according to claim 1, wherein
the semiconductor element includes six switching elements that form a three-phase AC inverter,
the three-phase AC inverter includes an output terminal that is disposed on the module surface, and
an output member electrically connected to the output terminal is disposed in the cooler.

6. The power converter according to claim 1, wherein
a portion of the one of the positive connecting member and the negative connecting member is interposed between the semiconductor module and the first surface of the insulation member to be electrically connected to the input terminal.

* * * * *